United States Patent
Kim et al.

(10) Patent No.: US 10,247,625 B2
(45) Date of Patent: Apr. 2, 2019

(54) APPARATUS FOR CORRECTING OF TEMPERATURE MEASUREMENT SIGNAL

(71) Applicant: LSIS CO., LTD., Gyeonggi-do (KR)

(72) Inventors: Hong-Seok Kim, Gyeonggi-do (KR); Jae-Moon Lee, Gyeonggi-do (KR); Chun-Suk Yang, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 184 days.

(21) Appl. No.: 15/350,316

(22) Filed: Nov. 14, 2016

(65) Prior Publication Data
US 2017/0307450 A1    Oct. 26, 2017

(30) Foreign Application Priority Data
Apr. 26, 2016 (KR) .................. 10-2016-0051149

(51) Int. Cl.
*G01K 15/00* (2006.01)
*G01K 7/22* (2006.01)
(Continued)

(52) U.S. Cl.
CPC ............. *G01K 15/005* (2013.01); *G01K 7/01* (2013.01); *G01K 7/22* (2013.01); *G01K 7/25* (2013.01);
(Continued)

(58) Field of Classification Search
None
See application file for complete search history.

(56) References Cited

U.S. PATENT DOCUMENTS

2007/0073510 A1*  3/2007  Kerkman ............... G01K 7/425
                                                 702/130
2009/0276165 A1* 11/2009  Weiss .................... H02P 27/00
                                                 702/34
(Continued)

FOREIGN PATENT DOCUMENTS

GB        939 486         10/1963
JP     2004-117111 A       4/2004
(Continued)

OTHER PUBLICATIONS

EPO translation of JP2004117111.*
(Continued)

*Primary Examiner* — Lisa M Caputo
*Assistant Examiner* — Nasir U. Ahmed
(74) *Attorney, Agent, or Firm* — K&L Gates LLP

(57) ABSTRACT

The present invention relates to an apparatus for correcting a temperature sensing signal of an IGBT temperature sensing device which outputs only a temperature sensing signal having a voltage value equal to or higher than a preset voltage value, by using an output limiting diode. The apparatus includes: a calculating part configured to calculate a conduction current value of the output limiting diode by using the resistance of an NTC thermistor included in the IGBT temperature sensing device; a determining part configured to determine a drop voltage value of a voltage drop occurring in the output limiting diode based on the conduction current value; and a correcting part configured to correct the temperature sensing signal by increasing the voltage of the temperature sensing signal output from the IGBT temperature sensing device by the drop voltage value.

5 Claims, 6 Drawing Sheets

(51) Int. Cl.
  *G01K 7/01* (2006.01)
  *G01K 7/25* (2006.01)
  *H03K 17/082* (2006.01)
  *H03K 17/08* (2006.01)

(52) U.S. Cl.
  CPC . *H03K 17/0828* (2013.01); *H03K 2017/0806* (2013.01); *H03K 2217/0027* (2013.01)

(56) References Cited

U.S. PATENT DOCUMENTS

2011/0286244 A1* 11/2011 Wei .................. H02M 7/53875
                                                          363/17
2012/0016610 A1    1/2012 Lan

FOREIGN PATENT DOCUMENTS

| JP | 2004108875 A | 4/2004 |
| JP | 2007-336728 A | 12/2007 |
| JP | 2014-25867 A | 2/2014 |
| JP | 2014070951 A | 4/2014 |
| JP | 5590240 B2 | 9/2014 |
| KR | 101481290 | 1/2015 |

OTHER PUBLICATIONS

European Search Report—Appl. No, 16193107.6-1805 dated Oct. 5, 2017—11 pages.
Diode Clippers—An overview of Clipping Circuits; Circuits Today (http://www.circuitstoday.com/diode-clippers);http://www.circuitstoday.com/diode-clippers—p. 21.

* cited by examiner

PRIOR ART bold # APPARATUS FOR CORRECTING OF TEMPERATURE MEASUREMENT SIGNAL

CROSS REFERENCE TO RELATED APPLICATION

This application claims the benefit of Korean Patent Application No. 10-2016-0051149, filed on Apr. 26, 2016, entitled "APPARATUS FOR CORRECTING OF TEMPERATURE MEASUREMENT SIGNAL", which is hereby incorporated by reference in its entirety into this application.

BACKGROUND

1. Technical Field

The present invention relates to an apparatus for correcting a temperature sensing (or measurement) signal and more particularly, to an apparatus for correcting a temperature sensing signal, which is capable of determining a value of voltage drop generated in an output limiting diode included in an IGBT temperature sensor by calculating a value of a current flowing through the output limiting diode and capable of correcting an error of a temperature sensing signal output from the IGBT temperature sensor, which is caused by the voltage drop of the output limiting diode, by increasing a voltage of the temperature sensing signal by the voltage drop value.

2. Description of the Related Art

In general, an IGBT (Insulated Gate Bipolar Transistor) refers to a high power switching transistor having a fast switching function to block or conduct a flow of electricity.

The switching function requires a dedicated part having a high operation speed and a low power loss for a product requiring a precise operation, although it may be implemented with other parts or circuits.

However, an existing switching semiconductor transistor has a demerit that it has a complicated circuit configuration and a low operation speed although it is inexpensive. In addition, an existing switching semiconductor MOSFET (Metal Oxide Semiconductor Field Effect Transistor) has a demerit that it is expensive although it consumes low power and has a high operation speed. IGBT is evaluated as a product having only the merits of the above-mentioned transistor and MOSFET. Accordingly, the IGBT is being used as a switching device in a variety of power converters such as an inverter, a converter and so on.

In typical, an IGBT for converting power of a high voltage and a large current generates hot heat due to resistance, which has an effect on stability and power efficiency of a power converter.

Accordingly, the IGBT is provided with an IGBT temperature sensing device for measuring (or sensing) a temperature of the IGBT by using an NTC (Negative Temperature Coefficient) thermistor.

The NTC thermistor is a thermistor whose electrical resistance is continuously changed with a negative temperature coefficient, and is used as a temperature sensor using this characteristic.

FIG. 1 is a circuit diagram of a conventional IGBT temperature sensing device.

Referring to FIG. 1, a conventional IGBT temperature sensor 10 includes a temperature sensor 11, a signal selector 12 and an AD input part 13.

An NTC thermistor $R_{NTC}$ of the temperature sensor 11 is changed in its resistance with a change in temperature of the IGBT. A first voltage distributing resistor $R_1$ and a second voltage distributing resistor $R_2$ of the temperature sensor 11 distribute a voltage of a driving power supply $V_{cc}$ to the NTC thermistor $R_{NTC}$ according to a preset ratio.

Accordingly, a temperature sensing signal is output to an output limiting diode $D_1$ according to the change in resistance of the NTC thermistor $R_{NTC}$.

The output limiting diode $D_1$ outputs the temperature sensing signal to the signal selector 12 only when a voltage of the temperature sensing signal is equal to or higher than a preset voltage.

The signal selector 12 compares a voltage of a previously received temperature sensing signal with a voltage of a recently received temperature sensing signal. If the voltage of the recently received temperature sensing signal is higher than the voltage of the previously received temperature sensing signal, the signal selector 12 outputs the recently received temperature sensing signal to the AD input part 13.

The AD input part 13 converts an analog voltage value of the temperature sensing signal to a digital voltage value which is then output to the outside or an IGBT controller.

The conventional IGBT temperature sensor 10 uses the output limiting diode $D_1$ conducted only when a driving voltage is applied to output only a temperature sensing signal having a voltage equal to or higher than the preset voltage value.

In this case, when the output limiting diode $D_1$ is conducted in a forward direction, a voltage drop occurs in the output limiting diode $D_1$. Accordingly, in the conventional IGBT temperature sensor 10, a voltage difference occurs between a temperature sensing signal before being input to the output limiting diode $D_1$ and a temperature sensing signal output from the output limiting diode $D_1$, which may cause an error in a measurement of the IGBT temperature due to the voltage difference.

SUMMARY

It is an aspect of the present invention to provide an apparatus for correcting a temperature sensing signal, which is capable of determining a value of voltage drop generated in an output limiting diode included in an IGBT temperature sensor by calculating a value of a current flowing through the output limiting diode and capable of correcting an error of a temperature sensing signal output from the IGBT temperature sensor, which is caused by the voltage drop of the output limiting diode, by increasing a voltage of the temperature sensing signal by the voltage drop value.

The present invention is not limited to the above aspect and other aspects of the present invention will be clearly understood by those skilled in the art from the following description. The above and/or other aspects and advantages of the present invention will become apparent and more readily appreciated from the following description of the embodiments, taken in conjunction with the accompanying drawings. It should be understood that the objects and advantages of the present invention can be realized by features and combinations thereof set forth in the claims.

In accordance with one aspect of the present invention, there is provided an apparatus for correcting a temperature sensing signal of an IGBT temperature sensing device which outputs only a temperature sensing signal having a voltage value equal to or higher than a preset voltage value, by using an output limiting diode, including: a calculating part configured to calculate a conduction current value of the output limiting diode by using the resistance of an NTC thermistor included in the IGBT temperature sensing device; a determining part configured to determine a drop voltage value of a voltage drop occurring in the output limiting diode based on the conduction current value; and a correcting part configured to correct the temperature sensing signal by increasing the voltage of the temperature sensing signal output from the IGBT temperature sensing device by the drop voltage value.

According to the present invention, it is possible to measure the IGBT temperature with precision by determining a value of voltage drop generated in an output limiting diode included in an IGBT temperature sensor by calculating a value of a current flowing through the output limiting diode, and correcting an error of a temperature sensing signal output from the IGBT temperature sensor, which is caused by the voltage drop of the output limiting diode, by increasing a voltage of the temperature sensing signal by the voltage drop value.

DETAILED DESCRIPTION

Figure 1:
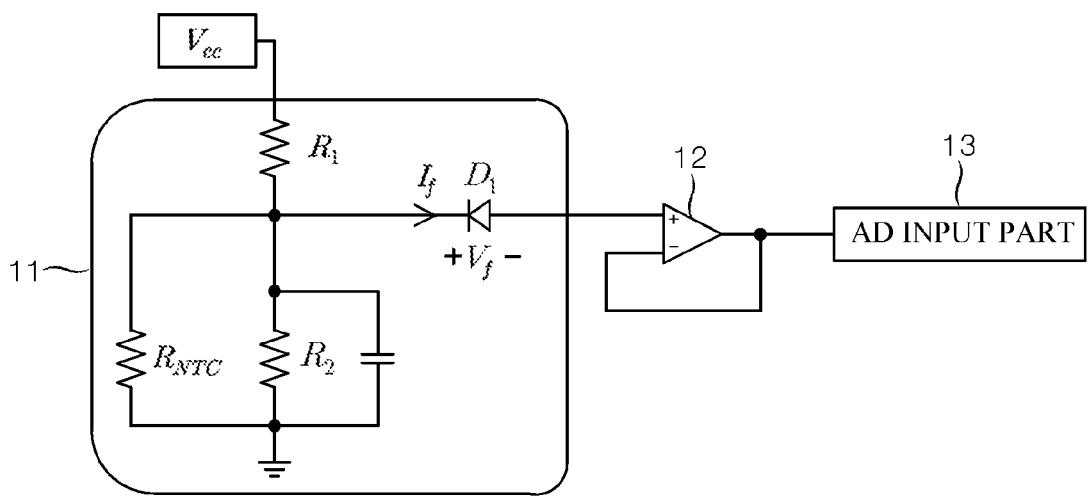
FIG. 1 is a circuit diagram of a conventional IGBT temperature sensing device.

The above objects, features and advantages will become more clearly apparent from the following detailed description in conjunction with the accompanying drawings. Therefore, the technical ideas of the present invention can be easily understood and practiced by those skilled in the art. In the following detailed description of the present invention, concrete description on related functions or constructions will be omitted if it is deemed that the functions and/or constructions may unnecessarily obscure the gist of the present invention. Hereinafter, preferred embodiments of the present invention will be described in detail with reference to the accompanying drawings. Throughout the drawings, the same or similar elements are denoted by the same reference numerals.

Figure 2:
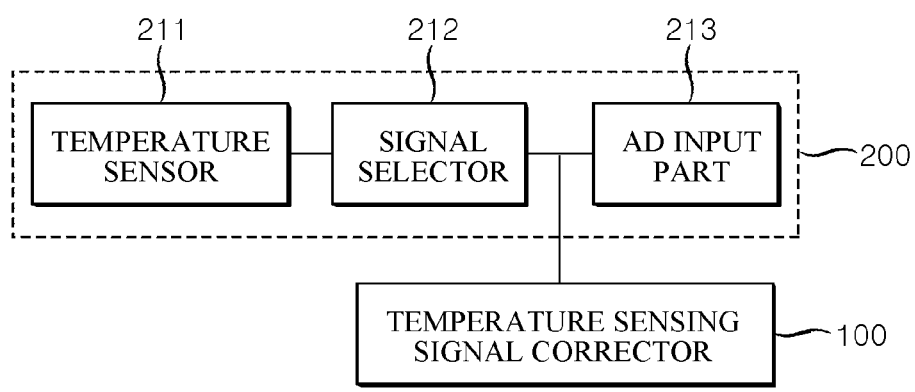
FIG. 2 is a block diagram illustrating an IGBT temperature sensing device provided with a temperature sensing signal corrector according to one embodiment of the present invention.
Figure 3:
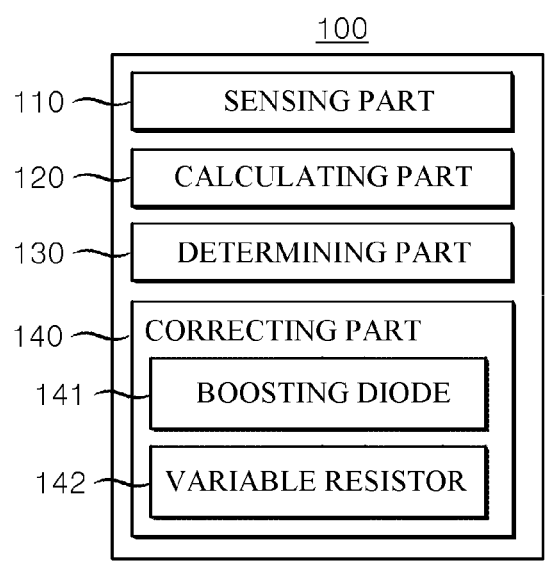
FIG. 3 is a schematic view illustrating the detailed configuration of the temperature sensing signal corrector according to one embodiment of the present invention.
Figure 4:
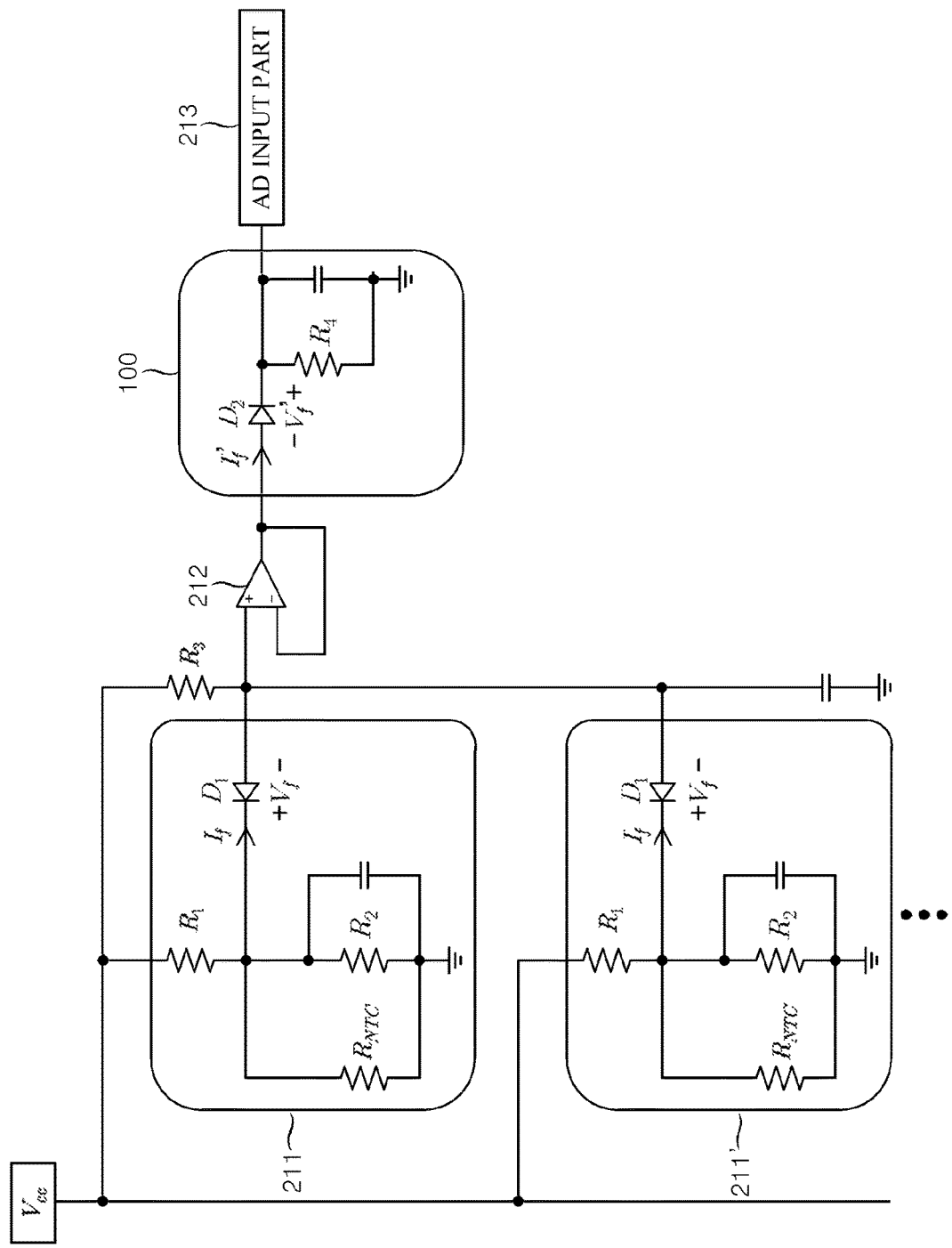
FIG. 4 is a circuit diagram of the temperature sensing signal corrector and the IGBT temperature sensing device according to one embodiment of the present invention.

FIG. 2 is a block diagram illustrating an IGBT temperature sensing device 200 provided with a temperature sensing signal corrector 100 according to one embodiment of the present invention. FIG. 3 is a schematic view illustrating the detailed configuration of the temperature sensing signal corrector 100 according to one embodiment of the present invention. FIG. 4 is a circuit diagram of the temperature sensing signal corrector 100 and the IGBT temperature sensing device 200 according to one embodiment of the present invention.

Referring to FIGS. 2 to 4, the IGBT temperature sensing device 200 provided with the temperature sensing signal corrector 100 according to the present invention includes a plurality of temperature sensors 211, a signal selector 212 and an AD input part 213.

An NTC thermistor $R_{NTC}$ of each temperature sensor 211 is installed in the IGBT and is changed in its resistance with a change in temperature of the IGBT. At this time, a first voltage distributing resistor $R_1$ and a second voltage distributing resistor $R_2$ of the temperature sensor 211 distribute a voltage of a driving power supply $V_{cc}$ to the NTC thermistor $R_{NTC}$ according to a preset ratio.

At this time, the first voltage distributing resistor $R_1$ may be connected between an input terminal of an output limiting diode $D_1$ and the driving power supply $V_{cc}$.

The second voltage distributing resistor $R_2$ may be connected between the input terminal of the output limiting diode $D_1$ and the ground and may be connected in parallel to the NTC thermistor $R_{NTC}$.

A current limiting resistor R3 is a resistor limiting a current value of a current flowing into the signal selector 212 to be described later and may be connected between an output terminal of the output limiting diode $D_1$ and the driving power supply $V_{cc}$.

With the above-described circuit structure of the temperature sensor 211, the temperature sensing signal with the change in resistance of the NTC thermistor $R_{NTC}$ can be input to the input terminal of the output limiting diode $D_1$.

The output limiting diode $D_1$ outputs the temperature sensing signal input to the input terminal to the signal selector 212 only when a voltage value of the temperature sensing signal is equal to or higher than the preset voltage value.

The signal selector 212 may compare a voltage of a previously received temperature sensing signal with a voltage of a recently received temperature sensing signal.

As a result of the comparison, if the voltage of the recently received temperature sensing signal is higher than the voltage of the previously received temperature sensing signal, the signal selector 212 selects and outputs the recently received temperature sensing signal to the temperature sensing signal corrector 100.

In one embodiment, the signal selector 212 may be an OP (Operational Amplifier).

The temperature sensing signal input to the signal selector 212 may be input from a plurality of temperature sensors 211 and 211'.

The temperature sensing signal corrector 100 according to one embodiment of the present invention includes a sensing part 110, a calculating part 120, a determining part 130 and a correcting part 140.

Upon receiving the temperature sensing signal from the signal selector 212 in the temperature sensing signal corrector 100, the sensing part 110 may measures the resistance of the NTC thermistor $R_{NTC}$ of the temperature sensor 211 selected by the signal selector 212.

Here, the NTC thermistor $R_{NTC}$ is a thermistor whose resistance is negatively changed with a change in temperature, and has a characteristic that the resistance is decreased with increase in an ambient temperature and increased with decrease in the ambient temperature.

In another embodiment, the sensing part 110 may measure the resistances of the NTC thermistors $R_{NTC}$ of all of the temperature sensors 211 in real time and output the resistance of the corresponding NTC thermistors $R_{NTC}$ upon receiving the temperature sensing signal from the signal selector 212.

More specifically, the sensing part 110 measures the resistances of all of the NTC thermistors $R_{NTC}$ in real time rather than measuring the resistance of any NTC thermistor $R_{NTC}$. Thereafter, upon receiving the temperature signal, the sensing part 110 may output the resistance of the NTC thermistor $R_{NTC}$ of the temperature sensor 211 selected by the signal selector 212.

The calculating part 120 may calculate a conduction current value of the output limiting diode $D_1$ based on the resistance of the NTC thermistor $R_{NTC}$ measured from the sensing part 110.

Here, the conduction current value may be a current value of a forward conduction current flowing into the output limiting diode $D_1$ as the output limiting diode $D_1$ is conducted when a voltage equal to or higher than a driving voltage $V_d$ is applied across the output limiting diode $D_1$.

At this time, the calculating part 120 can calculate the conduction current value of the output limiting diode $D_1$ by using the following equation 1.

$$I_f = \left(\frac{V_{cc}}{R_1 + R_{NTC}} \times R_1 + V_d\right) \times \frac{1}{R_3} \qquad <\text{Eq. 1}>$$

Where, $I_f$ is the conduction current value of the output limiting diode $D_1$, $V_{cc}$ is the driving power supply voltage of the IGBT temperature sensing device 200, $V_d$ is the driving voltage of the output limiting diode $D_1$, $R_{NTC}$ is the resistance of the NTC thermistor $R_{NTC}$, $R_1$ is the resistance of the first voltage distributing resistor $R_1$, $R_2$ is the resistance of the second voltage distributing resistor $R_2$, and $R_3$ is the resistance of the current liming resistor $R_3$.

The determining part 130 can determine a drop voltage value of a voltage drop occurring in the output limiting diode $D_1$ based on the conduction current value calculated from the calculating part 120.

When a conduction current is flown into the output limiting diode $D_1$ as the voltage equal to or higher than the driving voltage $V_d$ is applied across the output limiting diode $D_1$, the voltage drop occurs in the output limiting diode $D_1$. At this time, the drop voltage value may be a voltage value dropped in the output limiting diode $D_1$.

As described above, the temperature sensor 211 uses the output limiting diode $D_1$ to output only the temperature sensing signal having a voltage equal to or higher than the preset voltage value. However, when the output limiting diode $D_1$ is conducted, a voltage drop occurs in the output limiting diode $D_1$. Accordingly, a voltage difference occurs between a temperature sensing signal before being input to the output limiting diode $D_1$ and a temperature sensing signal output from the output limiting diode $D_1$.

The determining part 130 can determine the drop voltage value according to the conduction current value of the output limiting diode $D_1$ from the current/voltage characteristic data of the output limiting diode $D_1$.

The determining part 130 can determine the drop voltage value from a drop voltage value characteristic table according to a forward conduction current value provided from a maker of the output limiting diode $D_1$, as listed in the following table 1.

For example, if the conduction current value calculated from the calculating part 120 is 25.3 μA, the determining part 130 can determine a corresponding voltage value of 170 mV as the drop voltage value.

TABLE 1

| Conduction current value ($I_f$) [μA] | Drop voltage value ($V_f$) [mV] |
|---|---|
| 14.8 | 155 |
| 21.4 | 167 |
| 25.3 | 170 |
| 27.9 | 173 |
| 29.2 | 175 |

The correcting part 140 can increase a voltage of the temperature sensing signal output from the signal selector 212 by the drop voltage value determined by the determining part 130.

To this end, the correcting part 140 may include a boosting diode $D_2$ connected to the output terminal of the signal selector 212 and a variable resistor $R_4$ connected between the boosting diode $D_2$ and the ground.

The correcting part 140 can control the increased voltage value of the temperature sensing signal by changing a value of current flowing into the boosting diode $D_2$ by adjusting the resistance of the variable resistor $R_4$.

More specifically, the correcting part 140 can adjust the resistance of the variable resistor $R_4$ based on a characteristic table according to a backward conduction current value provided from a maker of the boosting diode $D_2$.

The correcting part 140 can search a conduction current value corresponding to the same boosting voltage value as the drop voltage value determined by the determining part 130 and adjust the resistance of the variable resistor $R_4$ so as to flow the searched conduction current into the boosting diode $D_2$.

The correcting part 140 can output the temperature sensing signal, which is corrected by increasing the voltage by the drop voltage value determined by the determining part 130, to the AD input part 213.

Thereafter, the AD input part 213 converts an analog voltage value of the input temperature sensing signal to a digital voltage value which is then output to the outside or an IGBT controller.

Figure 5:
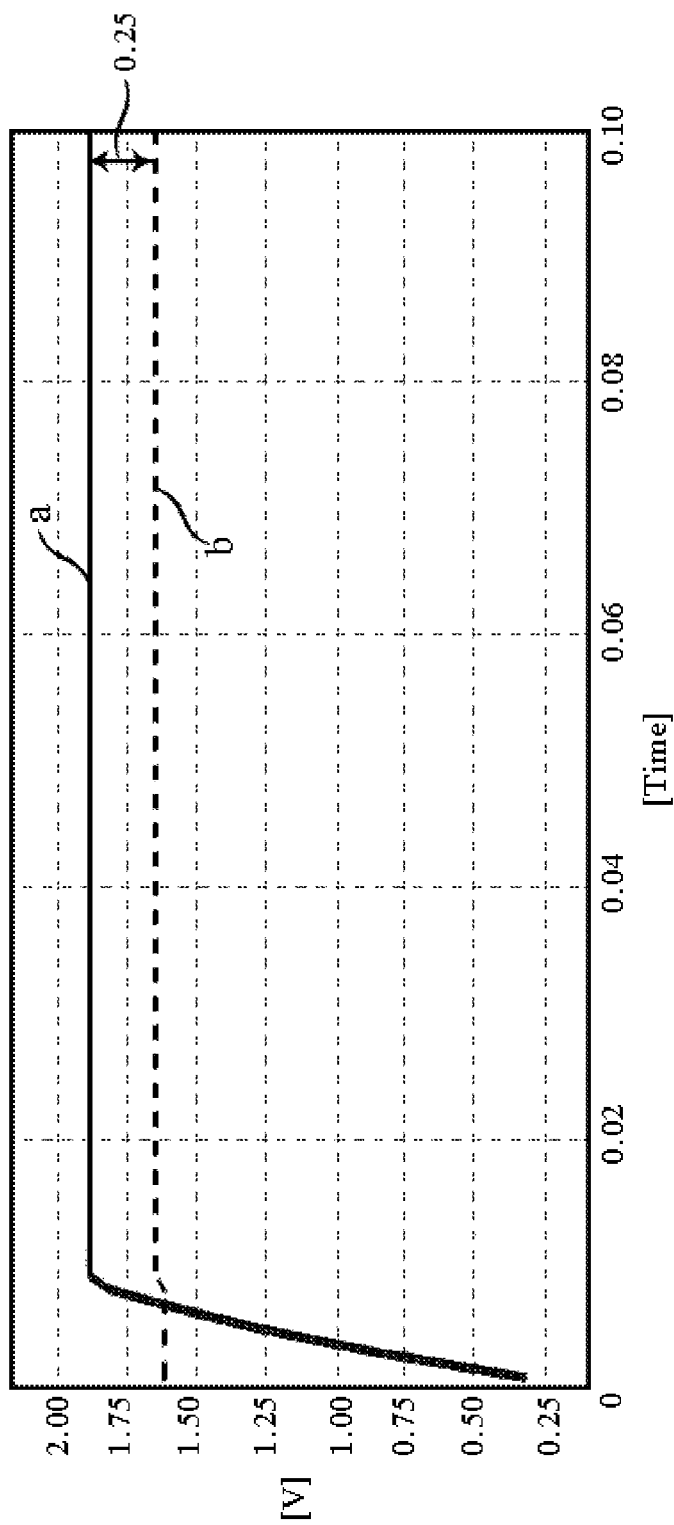
FIG. 5 is a graph showing a temperature sensing signal of an IGBT temperature sensed from the conventional IGBT temperature sensing device.
Figure 6:
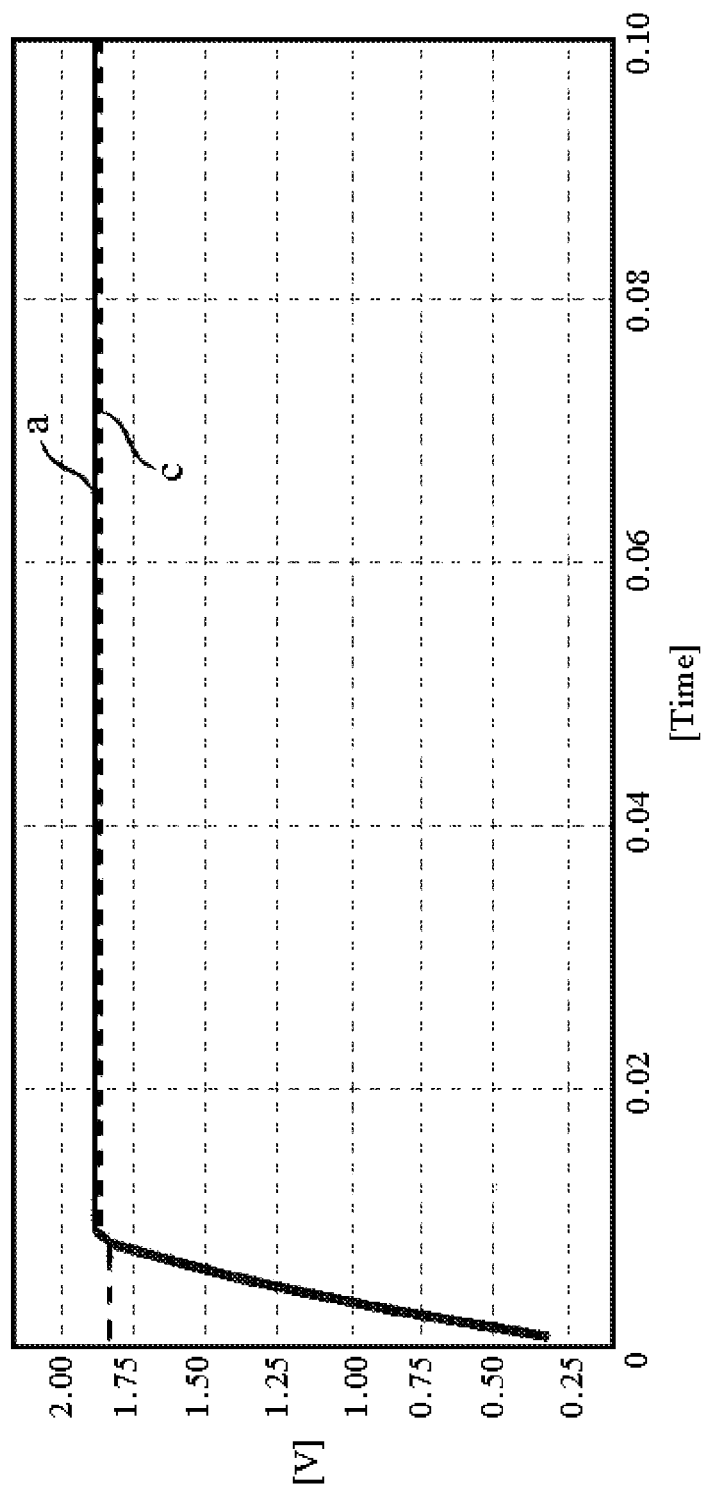
FIG. 6 is a graph showing a temperature sensing signal of an IGBT temperature corrected from the temperature sensing signal corrector according to one embodiment of the present invention.

FIG. 5 is a graph showing a temperature sensing signal of an IGBT temperature sensed from the conventional IGBT temperature sensing device. FIG. 6 is a graph showing a temperature sensing signal of an IGBT temperature corrected from the temperature sensing signal corrector 100 according to one embodiment of the present invention.

It can be seen from FIG. 5 that an error of about 0.25V occurs between a temperature sensing signal b of an IGBT temperature sensed from the conventional IGBT temperature sensing device and a temperature sensing signal a input to the AD input part 13 where no error occurs.

On the contrary, it can be seen from FIG. 6 that a temperature sensing signal c of an IGBT temperature corrected from the temperature sensing signal corrector 100 according to one embodiment of the present invention has no error from a section of about 0.01 sec.

In this manner, the temperature sensing signal corrector 100 according to one embodiment of the present invention can measure the IGBT temperature with precision by correcting a voltage drop of the temperature sensing signal occurring in the output limiting diode.

While the present invention has been particularly shown and described with reference to exemplary embodiments thereof, it will be understood by those skilled in the art that various changes in form and details may be made therein without departing from the spirit and scope of the present invention. The exemplary embodiments are provided for the purpose of illustrating the invention, not in a limitative sense. Thus, it is intended that the present invention covers the modifications and variations of this invention provided they come within the scope of the appended claims and their equivalents.

What is claimed is:

1. An apparatus for correcting a temperature sensing signal, the apparatus comprising:
   an insulated gate bipolar transistor (IGBT) temperature sensing device comprising
      a negative temperature coefficient (NTC) thermistor,
      a first voltage distributing resistor connected between an input terminal of an output limiting diode and a driving power supply,
      a second voltage distributing resistor connected between the input terminal of the output limiting diode and a ground, and
      a current limiting resistor connected between an output terminal of the output limiting diode and the driving power supply,
      wherein the IGBT temperature sensing device is configured to output only a temperature sensing signal having a voltage value equal to or higher than a preset voltage value, by using the output limiting diode, and
      wherein the NTC thermistor is connected between the input terminal of the output limiting diode and the ground, and the second voltage distributing resistor is connected in parallel to the NTC thermistor; and
   a temperature sensing signal corrector comprising
      a calculating part configured to calculate a conduction current value of the output limiting diode by using the resistance of the NTC thermistor included in the IGBT temperature sensing device,
      a determining part configured to determine a drop voltage value of a voltage drop occurring in the output limiting diode based on the conduction current value, and
      a correcting part configured to correct the temperature sensing signal by increasing the voltage of the temperature sensing signal output from the IGBT temperature sensing device by the drop voltage value,
      wherein the correcting part controls the increased voltage of the temperature sensing signal.

2. The apparatus according to claim 1, wherein the correcting part includes:
   a boosting diode which receives the temperature sensing signal and increases the voltage of the temperature sensing signal; and
   a variable resistor connected to the boosting diode, and
   wherein the increased voltage of the temperature sensing signal is controlled by changing a conduction current value of the boosting diode by adjusting the resistance of the variable resistor.

3. The apparatus according to claim 1, wherein the calculating part calculates the conduction current value of the output limiting diode by using the following equation, $$I_f = \left( \frac{V_{cc}}{R_1 + R_{NTC}} \times R_1 + V_d \right) \times \frac{1}{R_3}$$

where, $I_f$ is the conduction current value of the output limiting diode, Vcc is the driving power supply voltage of the IGBT temperature sensing device, $V_d$ is the driving voltage of the output limiting diode, $R_{NTC}$ is the resistance of the NTC thermistor, $R_1$ is the resistance of the first voltage distributing resistor, $R_2$ is the resistance of the second voltage distributing resistor, and $R_3$ is the resistance of the current liming resistor.

4. The apparatus according to claim 1, wherein the determining part determines the drop voltage value according to the conduction current value of the output limiting diode from current/voltage characteristic data of the output limiting diode.

5. The apparatus according to claim 1, further comprising a sensing part configured to measure the resistance of the NTC thermistor.

* * * * *